(12) United States Patent
Leenders et al.

(10) Patent No.: US 8,144,305 B2
(45) Date of Patent: Mar. 27, 2012

(54) LITHOGRAPHIC APPARATUS AND DEVICE MANUFACTURING METHOD

(75) Inventors: Martinus Hendrikus Antonius Leenders, Rhoon (NL); Nicolaas Ten Kate, Almkerk (NL); Michel Riepen, Bergschenhoek (NL); Sergei Shulepov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 590 days.

(21) Appl. No.: 11/436,057

(22) Filed: May 18, 2006

(65) Prior Publication Data

US 2007/0268466 A1 Nov. 22, 2007

(51) Int. Cl.
*G03B 27/52* (2006.01)
(52) U.S. Cl. .......................... 355/30; 355/53
(58) Field of Classification Search .............. 355/30, 355/53
See application file for complete search history.

(56) References Cited

U.S. PATENT DOCUMENTS

| | | | |
|---|---|---|---|
| 4,509,852 A | 4/1985 | Tabarelli et al. ............... 355/30 |
| 6,072,779 A | 6/2000 | Tzannes et al. | |
| 6,952,253 B2 | 10/2005 | Lof et al. | |
| 2004/0136494 A1 | 7/2004 | Lof et al. ........................ 378/34 |
| 2004/0160582 A1 | 8/2004 | Lof et al. | |
| 2004/0207824 A1 | 10/2004 | Lof et al. ........................ 355/30 |
| 2006/0038968 A1 | 2/2006 | Kemper et al. ................. 355/18 |
| 2006/0061739 A1 | 3/2006 | Hoogendam et al. | |
| 2006/0114435 A1 | 6/2006 | Hazelton et al. | |
| 2006/0221315 A1* | 10/2006 | Beckers et al. ................. 355/30 |
| 2008/0239261 A1 | 10/2008 | Novak | |

FOREIGN PATENT DOCUMENTS

| | | |
|---|---|---|
| EP | 1 420 300 A2 | 5/2004 |
| EP | 1 420 300 A3 | 8/2005 |
| JP | 2006120889 | 5/2006 |
| WO | WO99/49504 | 9/1999 |
| WO | 2004/055803 | 7/2004 |

OTHER PUBLICATIONS

Japanese Office Action dated Jun. 18, 2010, from Japanese Patent Application No. 2007-120671.

* cited by examiner

*Primary Examiner* — Edward Glick
*Assistant Examiner* — Mesfin T Asfaw
(74) *Attorney, Agent, or Firm* — Pillsbury Winthrop Shaw Pittman LLP (57) ABSTRACT

An immersion lithographic apparatus is disclosed in which a gas knife is shaped and a liquid removal device is positioned to improve removal of liquid from the surface of the substrate.

36 Claims, 5 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

Figure 2:
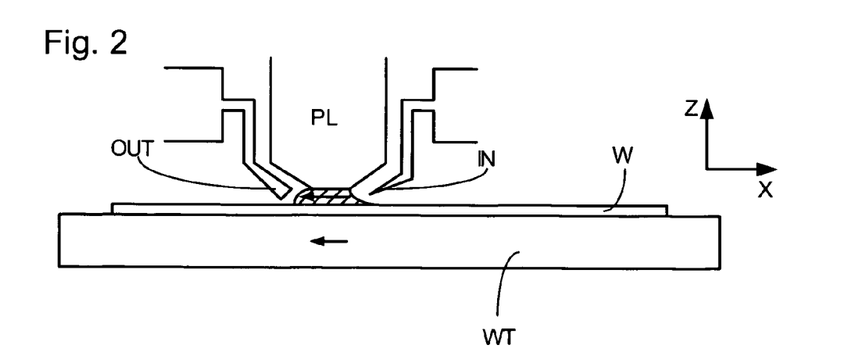
FIGS. 2 and 3 depict a liquid supply system for use in a lithographic projection apparatus.
Figure 3:
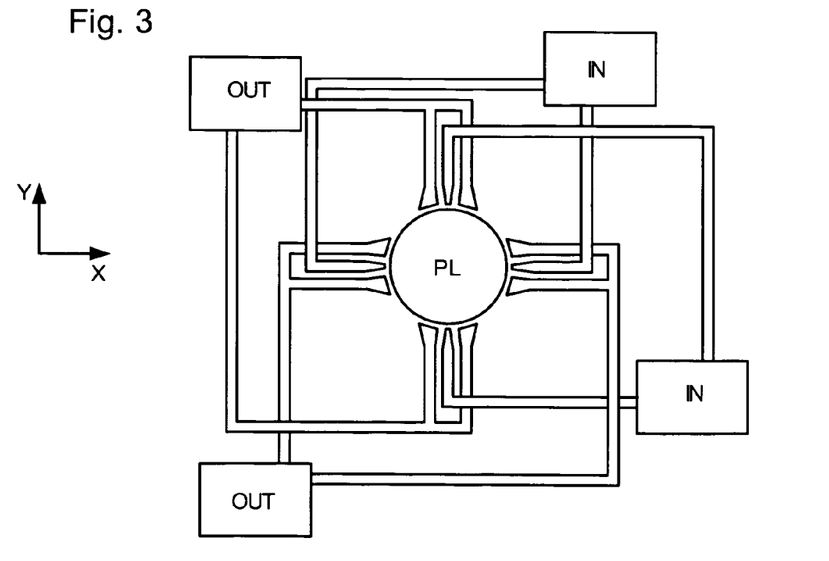

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
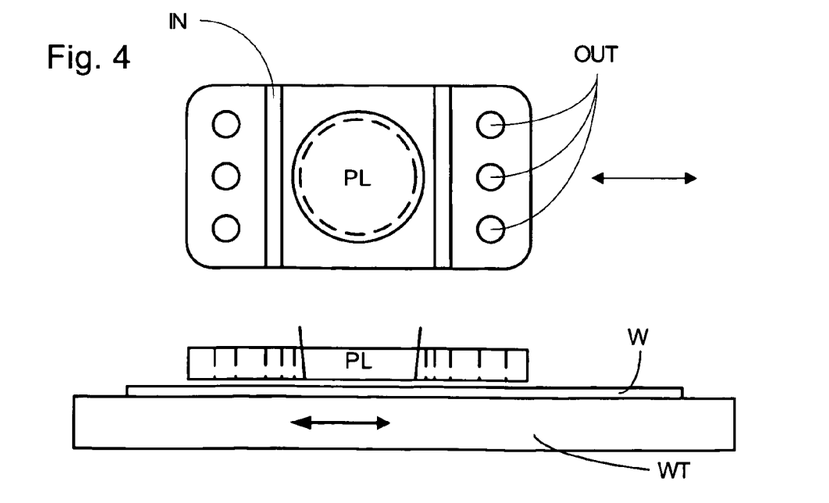
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

SUMMARY

It is desirable to improve liquid removal from the surface of a substrate and/or substrate table.

According to an aspect of the invention, there is provided a lithographic apparatus, comprising: a projection system configured to transfer a pattern from a patterning device onto a substrate; a liquid supply system configured to provide liquid to a space between the projection system and the substrate; a gas knife arranged to at least partly surround the space; and a liquid removal device positioned adjacent to and along a fraction of the gas knife, wherein the gas knife is shaped such that, on movement of the substrate in any direction in the plane of the substrate and which passes through an optical axis of the apparatus, in an arc of at least 36°, liquid on the substrate in a plane which is perpendicular to the plane of the substrate and which contains the direction will, by combined effect of the gas knife and further movement of the substrate in the direction, be transported along the gas knife to the liquid removal device.

According to an aspect of the invention, there is provided a lithographic apparatus, comprising: a projection system configured to transfer a pattern from a patterning device onto a substrate; a liquid supply system configured to provide liquid to a space between the projection system and a substrate; and a gas knife at least partly surrounding the space to contain liquid left on the substrate by the liquid supply system, wherein the gas knife is shaped, in plan, such that at least some portions have a local radius larger than an average radius of the gas knife, or at least some portions have a local radius smaller than an average radius of the gas knife, or both.

According to an aspect of the invention, there is provided a lithographic apparatus, comprising: a projection system configured to transfer a pattern from a patterning device onto a substrate; a liquid supply system configured to provide liquid to a space between the projection system and a substrate; and a gas knife sized, shaped and oriented such that, on movement of the substrate under the liquid supply system and under the gas knife, liquid left on the substrate following passage of the substrate under the liquid supply system is transported along the gas knife to a liquid removal area.

According to an aspect of the invention, there is provided a lithographic apparatus, comprising: a projection system configured to transfer a pattern from a patterning device onto a substrate; a barrier structure configured to at least partly surround a space between the projection system and the substrate and to at least partly constrain liquid in the space; and a gas knife positioned spaced apart from the barrier structure, wherein liquid on the substrate which has escaped from the barrier structure has a free surface between the barrier structure and the gas knife.

According to an aspect of the invention, there is provided an immersion lithographic apparatus, comprising: a projection system configured to transfer a pattern from a patterning device, through a liquid, onto a substrate; and a liquid removal device configured to remove liquid from a surface of the substrate, the liquid removal device comprising a plurality of extraction tubes connected to an under pressure, with an end, in use, directed towards the substrate and positioned within ten times the maximum tube end plan dimension of each other.

According to an aspect of the invention, there is provided an immersion lithographic apparatus, comprising: a projection system configured to transfer a pattern from a patterning device, through a liquid, onto a substrate; a gas knife; and a liquid removal device comprising a tube connected to an under pressure, an end of the tube positioned adjacent the gas knife and in a recess in a plan shape of the gas knife.

According to an aspect of the invention, there is provided a device manufacturing method comprising projecting a patterned beam of radiation using a projection system through a liquid onto a substrate, wherein liquid is contained by a gas knife at least partly surrounding the space, and wherein the gas knife is shaped, in plan, such that at least some portions have a local radius larger than an average radius of the gas knife, or at least some portions have a local radius smaller than an average radius of the gas knife, or both.

According to an aspect of the invention, there is provided a device manufacturing method comprising projecting a patterned beam of radiation using a projection system through a liquid, supplied by a liquid supply system, onto a substrate and transporting liquid left on the substrate following passage of the substrate under the liquid supply system along a gas knife to a liquid removal area.

According to an aspect of the invention, there is provided a device manufacturing method comprising projecting a patterned beam of radiation using a projection system through a liquid onto a substrate and allowing liquid to escape from a liquid containment device such that it is on the substrate with a free surface prior to removal of liquid using a gas knife.

According to an aspect of the invention, there is provided a device manufacturing method comprising projecting a patterned beam of radiation using a projection system through a liquid onto a substrate and removing liquid from a surface of the substrate using a plurality of extraction tubes which are connected to an under pressure, have an end directed towards the substrate and positioned within ten times of the maximum tube end dimension of each other.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
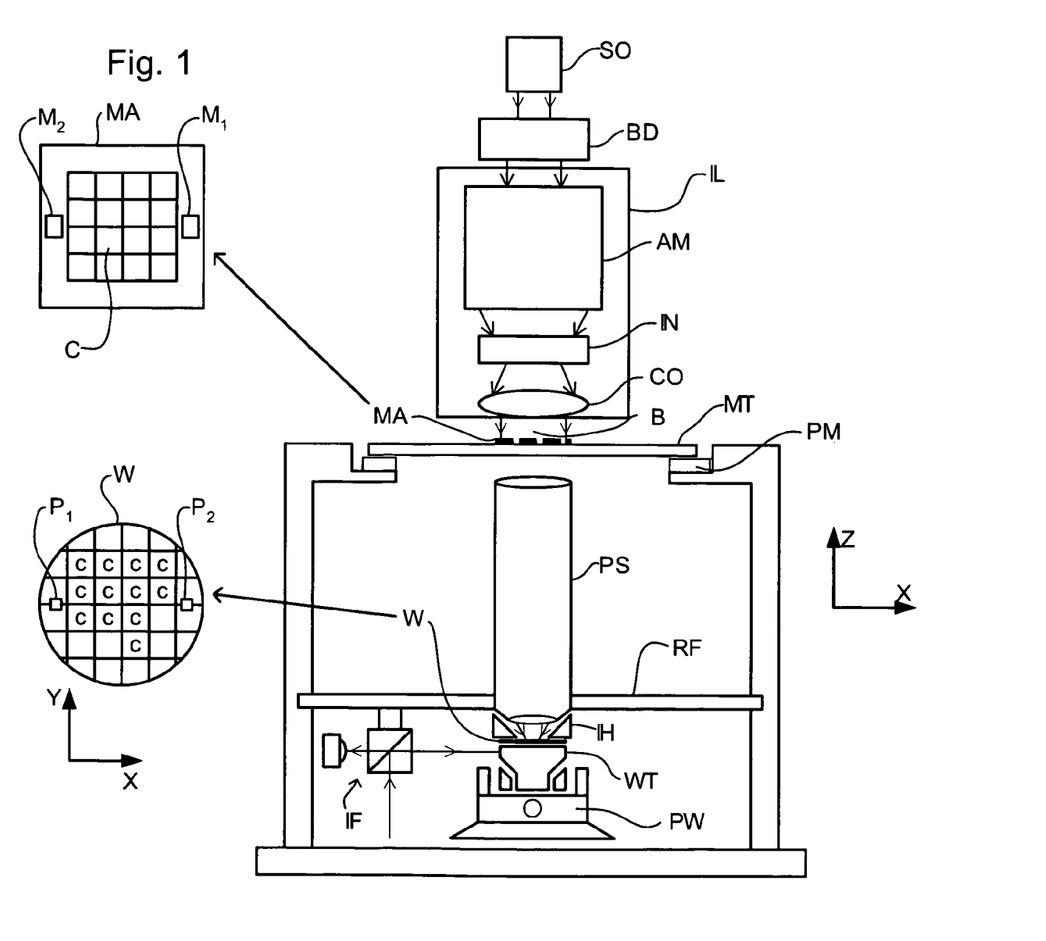
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
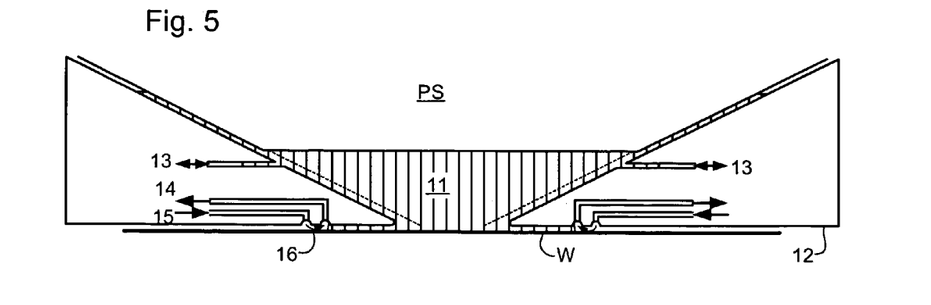
FIG. 5 depicts a further liquid supply system in accordance with an embodiment of the present invention.

Another immersion lithography solution with a localized liquid supply system solution which has been proposed is to provide the liquid supply system with a barrier structure which extends along at least a part of a boundary of the space between the final element of the projection system and the substrate table. Such a solution is illustrated in FIG. 5. The barrier structure is substantially stationary relative to the projection system in the XY plane though there may be some relative movement in the Z direction (in the direction of the optical axis). In an embodiment, a seal is formed between the barrier structure and the surface of the substrate and may be a contactless seal such as a gas seal.

The barrier structure 12 (shown, for example, as element IH in FIG. 1) at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the barrier structure 12 positioned below and surrounding the final element of the projection system PL. Liquid is brought into the space below the projection system and within the barrier structure 12 by liquid inlet 13 and may be removed by liquid outlet 13. The barrier structure 12 may extend a little above the final element of the projection system and the liquid level rises above the final element so that a buffer of liquid is provided. The barrier structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the barrier structure 12 and the surface of the substrate W. The gas seal is formed by gas, e.g. air or synthetic air but, in an embodiment, $N_2$ or another inert gas, provided under pressure via inlet 15 to the gap between barrier structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

Figure 6:
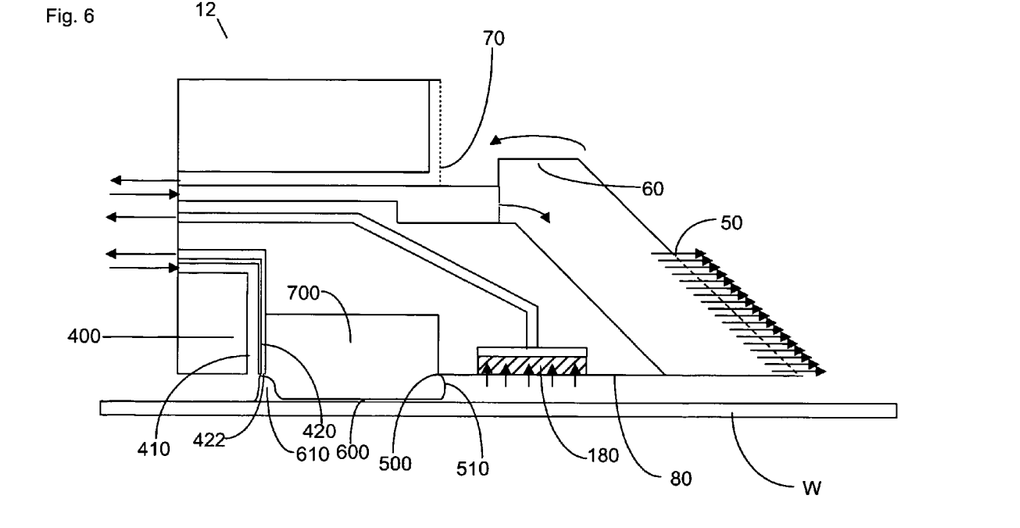
FIG. 6 illustrates a liquid supply system in accordance with an embodiment of the present invention.

FIG. 6 illustrates, in cross-section, an embodiment of a barrier structure 12 which is part of a liquid supply system LSS. The barrier structure 12 extends around the periphery of the final element of the projection system PS such that the barrier structure (which may be called a seal member) is, for example, substantially annular in overall shape. The projection system PS may not be circular and the inner and/or outer edge of the barrier structure 12 may also not be circular so that it is not necessary for the barrier structure to be ring shaped and it could also be other shapes so long as it has a central opening through which the projection beam PB may pass out of the final element of the projection system PL through liquid contained in the central opening and onto the substrate W.

The function of the barrier structure 12 is to at least partly maintain or confine liquid in the space between the projection system PS and the substrate W so that the projection beam PB may pass through the liquid.

The barrier structure 12 comprises a plurality of inlets 50 through which liquid is provided into the space between the final element of the projection system PS and the substrate W. Liquid may flow over the protrusion 60 and then be extracted through extractor 70. This arrangement can substantially prevent overflowing of the liquid over the top of the barrier structure 12. The top level of the liquid is simply contained by the presence of the barrier structure 12 and the level of liquid in the space is maintained such that the liquid does not overflow over the top of the barrier structure 12.

Figure 7:
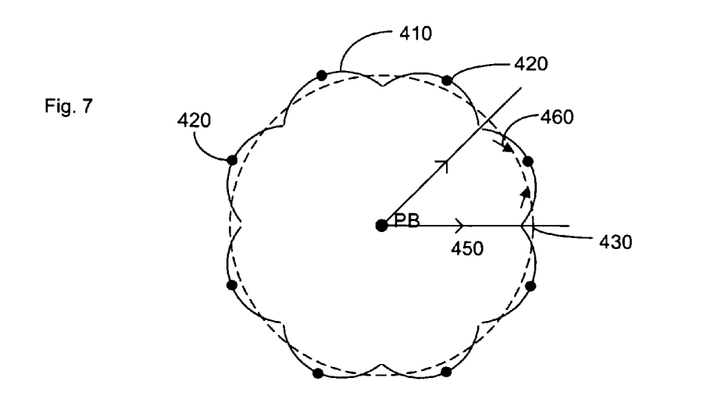
FIG. 7 illustrates a first embodiment of the present invention useable with the liquid supply system of FIG. 6.

A seal is provided between the bottom of the barrier structure 12 and the substrate W. In FIG. 6 the seal is a contactless seal and a device to provide the seal is made up of several components. Working radially outwardly from the optical axis of the projection system PS along the bottom 80 of the barrier structure 12 there is provided a single phase extractor 180 such as the one disclosed in United States patent application publication no. US 2006-0038968, incorporated herein in its entirety by reference. Any type of liquid extractor can be used. In an embodiment, the liquid extractor comprises an inlet which is covered in a porous material which is used to separate liquid from gas to enable single-phase liquid extraction. Radially outwardly of the single-phase extractor 180 is a meniscus pinning feature 500 which in the case of the embodiment illustrated in FIG. 7 is a sharp corner though clearly other meniscus pinning features may be used. This meniscus pinning feature 500 pins a meniscus of liquid 510 at that position. However, a film of liquid 600 is still likely to remain on the surface of the substrate W. A recess 700 is provided in the bottom surface of the barrier structure 12 such that the film of liquid 600 is not constrained and has a free top surface. Radially outwardly of the recess 700 is a gas knife and liquid extractor assembly 400 which will be described in more detail below. An embodiment of the present invention is directed to the gas knife and liquid extractor assembly and can be used with any liquid supply system, including those illustrated in FIGS. 2-5 and in particular those types of liquid supply system which provide liquid to a localized area of the substrate (i.e. those which provide liquid to a top surface area of the substrate W smaller, in plan, than the overall top surface area of the substrate W and relative to which the substrate W is moved). The gas knife and liquid extractor assembly 400 can form part of the liquid supply system LSS as illustrated in FIG. 6 or can be separate from the remainder of the liquid supply system. The single phase extractor 180 and meniscus pinning feature 500 of the FIG. 6 embodiment could be replaced with any other type of (partial) seal.

The gas knife assembly 400 comprises a gas knife 410 which extends around the entire periphery of the barrier structure 12 thereby surrounding the space 11. This is not necessarily the case and there may be areas at which the gas knife 410 is not continuous. Radially inwardly of the gas knife 410 in the cross-section in FIG. 6 is a liquid extractor 420.

As will be described with reference, in particular, to FIGS. 7-10, the liquid extractor 420 is not positioned peripherally around the entire space occupied by liquid but is only positioned at discrete locations. Indeed, the liquid extractor 420 is actually comprised of several individual discrete liquid extractors positioned at places along the (peripheral) length of the gas knife 410. The locations at which the liquid extractor 420 is positioned can be regarded as stagnation points which are points at which liquid which is moving away from the optical axis of the apparatus (along which the projection beam PB propagates) is concentrated by the shape of the gas knife 410. In an embodiment, the liquid extractor extends along less than 0.05 of the gas knife. This will be described in more detail below.

As can be seen from FIG. 6, the effect of the gas knife is to create a build-up of liquid 610 just radially inwardly of the gas knife 410. A fast jet of gas is directed by the gas knife 410 in a direction substantially perpendicular to the top surface of the substrate W. The gas knife 410 is designed to move this build-up of liquid, in combination with the moving substrate W, to one of the so called stagnation points at which a liquid removal device 420 will be able efficiently to remove the build-up of liquid 610.

The maximum speed at which the substrate W may move under the projection system PS and/or the barrier structure 12 is determined at least in part by the speed at which the build-up of liquid 610 breaks through the gas knife. Thus, this build-up of liquid should be removed before its pressure becomes great enough to force its way past the gas knife 410. This is achieved in an embodiment of the present invention by ensuring that the build-up of liquid is moved along the gas knife to an extraction point. This allows the liquid extractor 420 to operate efficiently because the build-up of liquid will completely or substantially cover its end or inlet 422 such that the extractor extracts exclusively or substantially liquid rather than a mixture of liquid and gas. In the mode of operation where substantially only liquid is extracted the efficiency of the extractor is increased. This will be described in more detail below with reference to FIGS. 11*a* and 11*b*.

Figure 8:
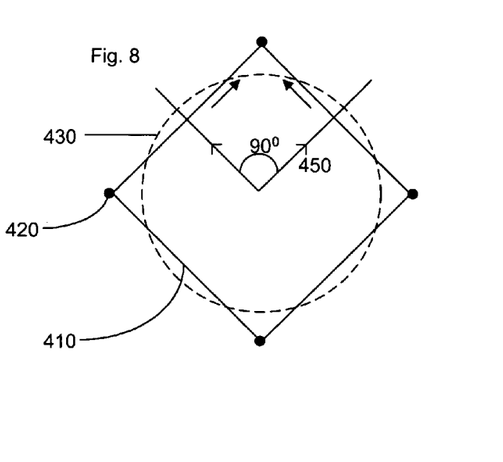
FIG. 8 illustrates a second embodiment useable with the liquid supply system according to FIG. 6.
Figure 9:
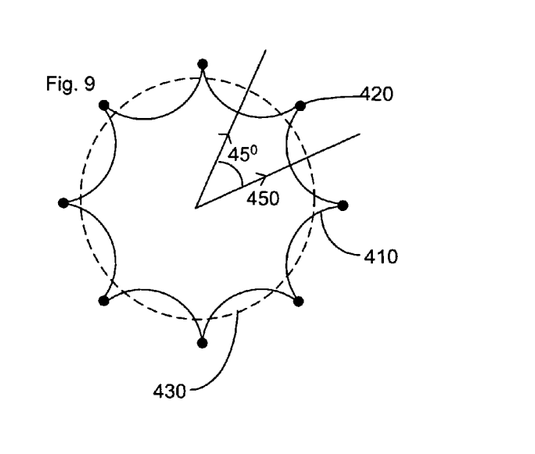
FIG. 9 illustrates a third embodiment useable with the liquid supply system according to FIG. 6.

FIGS. 7-10 illustrate four embodiments in which the shape of the gas knife 410 and position of the individual liquid removal devices 420 are arranged so as to concentrate liquid at the liquid removal devices by combined effect of the gas knife and movement of the substrate. In general an embodiment of the invention can be seen as the shaping of the gas knife, in plan, such that, on movement of the substrate W in any direction which lies in an arc of at least 36° and which direction is in the plane of the substrate and which direction passes through the optical axis of the apparatus, liquid on the substrate which is perpendicular to the plane of the substrate and which contains the direction in which the substrate is moving will, by combined effect of the gas knife and further movement of the substrate in the movement of direction, be transported along the gas knife to a liquid removal device. Each of FIGS. 7-9 show such an arc (in the cases of FIGS. 7 and 9 the arc is 45° because there are eight liquid removal devices 420 and in the case of FIG. 8 the arc is 90° because there are only four liquid removal devices). The directions of movement of the substrate W are illustrated by lines 450 and it will be seen that when liquid initially on that line meets the gas knife 410 by continued movement of the substrate in the direction 450 liquid will move along the gas knife 410 because it cannot get past the gas knife 410 but still has a component of the velocity of the substrate moving in direction 450 towards the liquid removal device in the respective arc. The direction of movement of the liquid is illustrated by arrows 460. It will clearly be appreciated that in the embodiments of FIGS. 8 and 9 the arc at which the liquid is transported to only a single one of the liquid removal devices is actually less than 90° and less than 45° respectively because if the direction 450 is perpendicular to the gas knife 410, the liquid will not have a component towards either of the liquid removal devices to its left and right when it impinges on the gas knife 410.

Furthermore, it will be appreciated that the above is simply a definition of the shape of the gas knife. Liquid which is not positioned on the substrate in a plane perpendicular to the plane of the substrate and which plane contains the direction 450 will also be transported along the gas knife 410 when it impinges on it and will be transported towards one of the liquid removal devices. An embodiment of the invention relates to the sizing, shaping and orientation of the gas knife such that, on movement of the substrate under the liquid supply system and under the gas knife, liquid left on the substrate following passage of the substrate under the liquid supply system LSS will be transported along the gas knife to a liquid removal area. At the liquid removal area the build-up of liquid 610 will be concentrated such that liquid extraction at the liquid removal area becomes more efficient.

FIG. 7 shows the gas knife and liquid extractor assembly 400 in plan. The shape of the gas knife 410 is shown in solid lines and the location of the liquid extractors 420 is also shown. Furthermore, an imaginary circle 430 has been superimposed (dotted line) which represents an average radius of the gas knife 410. As can be seen, the gas knife is comprised of eight segments each which has a radius of less than the average radius of the gas knife so that there are areas of the gas knife which are closer to the projection beam PB and areas which are further away than the average radius. The liquid extractors 420 are positioned at those parts of the gas knife which are furthest away just radially inwardly of the gas knife as is illustrated in FIG. 6. As will be appreciated, in any position where liquid is moving away from the optical axis of the projection beam and impinges on the gas knife 410, upon further movement of the liquid in that direction it will be forced by the gas knife along the gas knife towards a liquid removal device 420 as described above. In an embodiment, the one or more of the segments may have a radius that is larger than the average radius. In an embodiment, at least some segments have a local radius of less than 0.9 of the average radius or of greater than 1.1 of the average radius. In an embodiment, the local radius is at least ten times larger than the average radius.

It will be noted that all of the liquid collection devices 420 are positioned further from the projection beam PB than the average radius of the gas knife.

FIG. 8 illustrates a second embodiment of the gas knife assembly 400 in which the gas knife 410 is comprised of four segments which are each straight. At each of the meeting points of those four segments there is provided a liquid removal device 420. In this instance the radius of the individual straight parts of the gas knife 410 can be considered to be infinity. The sharp changes in direction can be considered to have a radius of zero. Again, upon movement of liquid away from the optical axis of the apparatus, as represented by the projection beam PB, in either the x (step direction) or y direction (scan direction) the liquid will be directed by the gas knife to a collection point at the junction between two separate parts of the gas knife 410 where there is a liquid removal device 420 at which efficient removal of the liquid becomes possible.

In FIG. 9 a third embodiment is depicted in which the gas knife 410 is comprised of eight portions each of which have a radius which is smaller than the average radius but which is curved in the opposite direction from that shown in FIG. 7. Again the shape of the gas knife 410 is such that liquid moving away from the optical axis of the apparatus will be directed towards the stagnation points at which the liquid removal devices 420 are situated.

It will be appreciated that the gas knife does not need to be shaped to have a radius over a significant proportion of its length. For instance the arrangement whereby a stagnation point is formed at a position along the length of the gas knife 410 could also be arranged by using a plurality of segments with the same radius as the average radius. This would be arranged by arranging for the radius of those portions to not share a central axis with the average radius. However, portions of the gas knife, for example where those individual sections meet, would have a radius which is not equal to the average radius. Thus, it can be seen that there are many shapes which will provide the desired effect of transporting the build-up of liquid 610 along the gas knife 410 towards a stagnation point.

It will furthermore be appreciated that the fewer stagnation points provided around the periphery of the gas knife, the greater the build-up of liquid at the stagnation points and thereby the more efficient the extraction system 420. In an embodiment, there are fewer than 10 stagnation points along the periphery of the gas knife 410 (thus the 36° arc). In an embodiment, as illustrated in FIG. 8, the shape of the gas knife 410 is optimized for movements mainly in the y and/or x directions.

Figure 10:
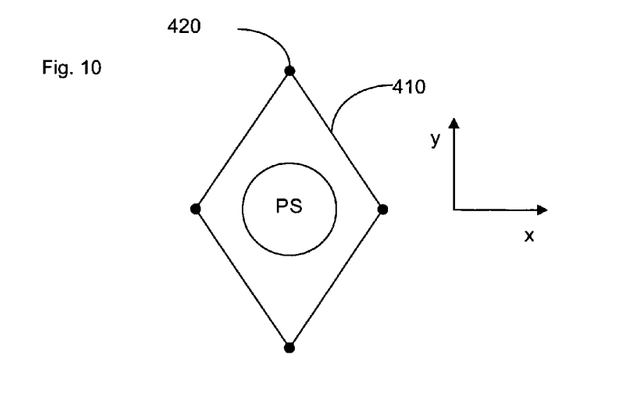
FIG. 10 illustrates a fourth embodiment of the present invention useable with the liquid supply system of FIG. 6.

FIG. 10 shows a shape of the gas knife in which the embodiment of FIG. 8 is elongated in the y (scan) direction and the stagnation points are provided on the x and y axes of symmetry of the gas knife 410. As will be described with respect to FIGS. 11 and 12, it is advantageous that the stagnation points at which liquid will be collecting during the scan motion (which is the motion with the fastest movement) enables even faster movement than a totally symmetrically shaped gas knife 410. This is because by the elongation of the shape of FIG. 8 the angle normal to the gas knife 410 has a reduced component in the y direction thereby increasing the scan speed at which a given quantity of liquid breaks through the gas knife.

Figure 11A:
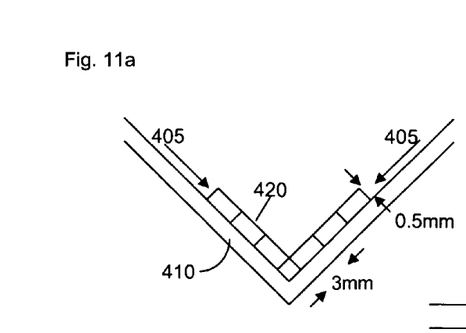
FIG. 11 illustrates a first embodiment of a liquid removal device according to the present invention.
Figure 11B:
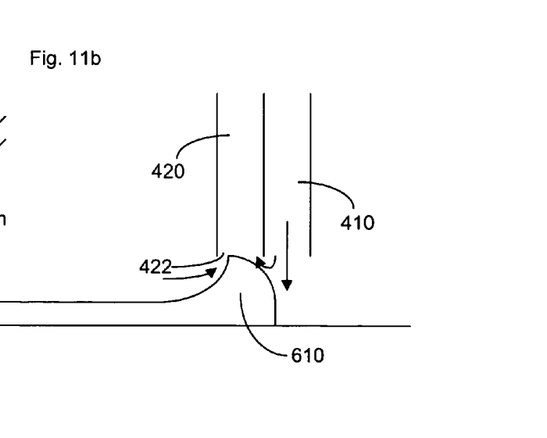

FIG. 11a illustrates, in plan, a liquid extractor 420 according to an embodiment of the present invention. Liquid is transported in the direction of arrows 405 along the gas knife 410 towards the liquid extractor 420. The liquid extractor 420 comprises a plurality of tubes each with an inlet 422 facing the substrate W (see FIG. 6). Each of the tubes is individually connected to an under pressure. In this way, if the build-up 610 of liquid covers the entire inlet 422 of a single tube, that tube will extract 100% liquid which is the most efficient way of extracting liquid. If the inlet 422 is not covered by liquid, a mixture of liquid from the build-up 610 and gas from the gas knife and from the recess 700 will be extracted through the tube. This extraction is less efficient. Thus, by transporting the build-up 610 along the gas knife to an extraction area the likelihood of a single tube having its inlet 422 covered by liquid increases. Such a construction can also be used for meniscus pinning with some liquid extraction. The high gas flow rate into the tubes creates a force on the meniscus to hold it in place. Furthermore, by splitting up the liquid extractors into individual extractor tubes, the chances of a single extractor having its end or inlet 422 completely immersed goes up while the total capacity of the extractor 420 is kept higher than the provision of a single tube but the same as the provision of a single extractor with the same combined area of inlets as the plurality of tubes. In an embodiment, the individual tubes have an aspect ratio of less than 20:1, less than 10:1, less than 5:1 or less than 3:1. A useful dimension would be 0.5 mm by 3 mm. In an embodiment, the maximum dimension of the inlet is less than 5 mm and the minimum dimension is at least 3 mm. A tube which has a high aspect ratio with the long side facing the center of the barrier structure 12 may be most efficient because liquid will be removed all along its length. Rate of gas extraction is dependent on the cross-sectional area of the inlet of the tube so that a round inlet will require a higher gas extraction rate for a given liquid extraction rate than a slit with a high aspect ratio for the same rate of liquid extraction. In an embodiment, a low gas extraction rate is desired.

Figure 12:
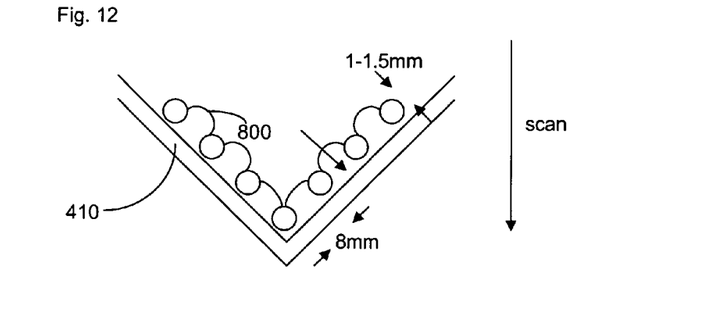
FIG. 12 illustrates a second embodiment of a liquid removal device according to the present invention.

FIG. 12 shows a second embodiment of the extractor in which the tubes have individual separate inlets as opposed to being a groove which has been split up into individual tubes as is the case in FIG. 11a. As can be seen from FIG. 12, a meniscus of liquid 800 forms between the tubes. The breakdown of the meniscus occurs when the velocity component perpendicular to the meniscus surface exceeds a given value. Thus, it can be seen that by elongating the shape of the gas knife such as in FIG. 10 in the scan direction (y) the component of the scan velocity which is in that direction perpendicular to the meniscus surface is decreased thereby allowing a faster scan speed. In an embodiment, the diameter of the tubes is between 0.5 mm and 2.5 mm. However, in an embodiment, only one tube may be provided. In an embodiment, the separation of the tubes is less than 10 times their maximum dimension. Thus, in the case of tubes with a circular outlet with a diameter of 1 mm, the maximum separation of the tubes should be 10 mm. Of course even in the embodiment of FIG. 12, the tubes could have an inlet shape, in plan, which is not circular but which is square and which could have as aspect ratio of up to 20:1 but, in an embodiment, less than 10:1, less than 5:1 or less than 3:1.

Figure 13:
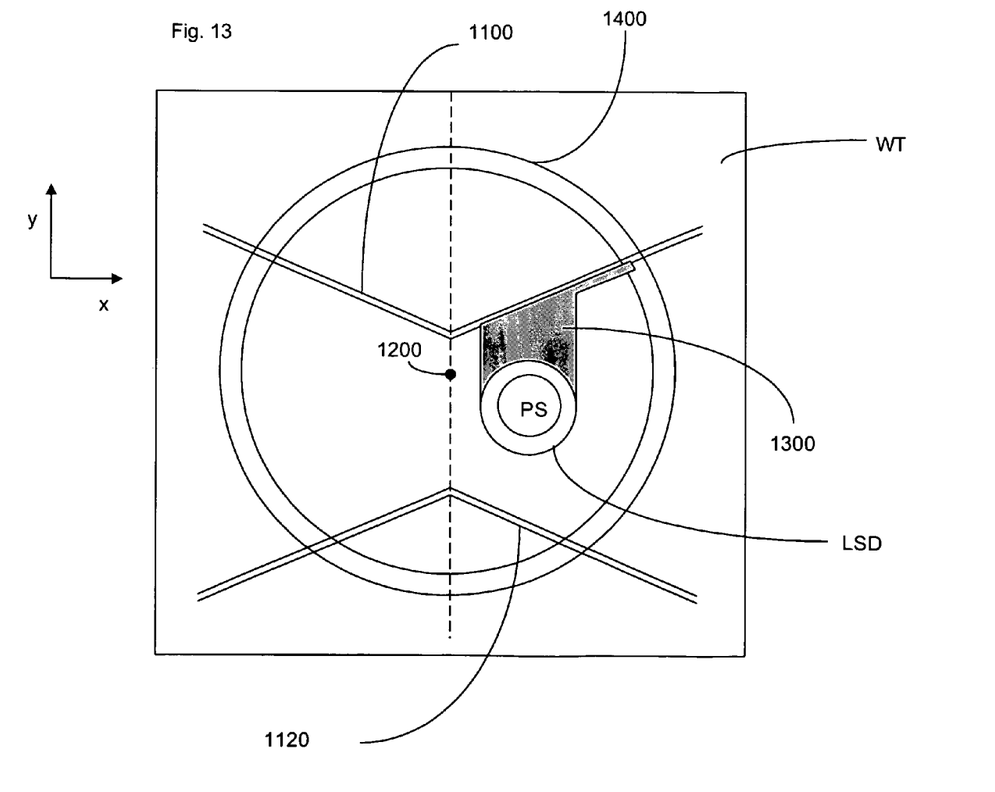
FIG. 13 illustrates an embodiment of the present invention.

FIG. 13 shows another embodiment of the present invention. In FIG. 13 a substrate table WT is illustrated which supports the substrate W. A liquid supply device LSD is provided and the substrate W and substrate table WT move under the stationary liquid supply device LSD and stationary projection system PS. Two gas knives 1100, 1120 are provided on either side of the liquid supply device LSD but are not attached to the liquid supply device. The two gas knives 1100, 1120 are shaped as V's with the point of the V pointing towards the central axis 1200 of the substrate W. In an embodiment, the two sides of the V meet at an acute angle of less than 45°.

In the embodiment illustrated in FIG. 13 the gas knives 1100, 1120 are stationary in the y (scan) axis relative to the projection system PS but they are arranged to step in the x direction in synchronization with the substrate table WT and substrate W. In an embodiment, the gas knives 1100, 1120 are dynamically isolated from the liquid supply device LSD perhaps by being attached to a base frame of the lithographic apparatus. The base frame supports the substrate table WT whereas the reference frame RF supports the projection system PS and is dynamically isolated from the base frame BF.

Shaded area 1300 represents a film of liquid which is left behind by the liquid supply system as the substrate W moves under the liquid supply device (in the scan direction) and the projection system PS. In the illustration, the substrate table WT and substrate W are being scanned downwards in the y direction. When the liquid hits the gas knife, as in the other embodiments, the liquid is transported along the gas knife radially outwardly. The substrate table WT is supplied with a drain 1400 which surrounds the substrate W. Thus, liquid which is transported by the combination of the gas knife 1100, 1120 and the movement of the substrate table WT reaches the drain 1400 and can thereby be removed.

It will be noted that the embodiment of FIG. 13 does not have a gas knife 1100, 1120 which surrounds the liquid supply device. This is unnecessary as during the scanning of the substrate table WT and substrate W under the projection system PS the gas knives 1100, 1120 will act like "windscreen wipers" and clear any liquid on the substrate. In the embodiment where the gas knives 1100, 1120 step with the substrate WT in the step (x) direction, the gas knife should be arranged to extend along the whole diameter of the substrate. Furthermore the gas knife is angled relative to the x direction (i.e. does not lie in the x direction) such that the combination of the scanning movement and the gas knife lead to transport of the liquid towards the drain 1400. Of course the gas knives 1100, 1120 do not necessarily need to be V shaped or indeed straight but this is likely an efficient arrangement.

In one or more of the above embodiments the film of liquid 600 leaving the liquid supply system LSS has a free top surface which is unconstrained by a surface. This free surface enables the gas knife to be decoupled from the meniscus.

While one or more embodiments have been described with respect to liquid removal from a substrate, one or more embodiments may be applicable to other areas, e.g., the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a projection system configured to transfer a pattern from a patterning device onto a substrate;
a liquid supply system configured to provide liquid to a space between the projection system and the substrate;
a gas knife arranged to at least partly surround the space; and
a liquid removal device positioned adjacent to and along a fraction of the gas knife, wherein
the gas knife is shaped such that, on movement of the substrate in any direction in the plane of the substrate and which passes through an optical axis of the apparatus, in an arc of at least 36°, liquid on the substrate in a plane which is perpendicular to the plane of the substrate and which contains the direction will, by combined effect of the gas knife and further movement of the substrate in the direction, be transported along the gas knife to the liquid removal device,
the gas knife comprises a plurality of segments, each segment being elongate and having an inlet for gas, and
the liquid removal device is situated at a region at which neighboring segments join such that a distance, from the optical axis, of the furthest outward point of an outer edge of an outlet of the liquid removal device is greater than or equal to a distance, from the optical axis, of the nearest inward point of an inner edge of the gas knife segment adjacent the outlet of the liquid removal device and that a distance, from the optical axis, of the innermost point of an inner edge of the outlet of the liquid removal device is less than or equal to a distance, from the optical axis, of the furthest outward point of an outer edge of the gas knife segment adjacent the outlet of the liquid removal device.

2. The apparatus of claim 1, wherein the liquid removal device extends along less than 0.05 of the gas knife.

3. The apparatus of claim 1, wherein the shape of the gas knife in plan is elongated in a scan direction.

4. The apparatus of claim 1, wherein the gas knife is stationary with respect to the liquid supply system.

5. The apparatus of claim 1, comprising four segments and each segment is substantially straight.

6. A lithographic apparatus, comprising:
a projection system configured to transfer a pattern from a patterning device onto a substrate;
a liquid supply system configured to provide liquid to a space between the projection system and a substrate;
a gas knife at least partly surrounding the space to contain liquid left on the substrate by the liquid supply system, wherein the gas knife has an average radius relative to the center of the gas knife and the gas knife is shaped, in plan, such that at least some portions have a local radius relative to a center non-coincident with the center of the gas knife larger than the average radius of the gas knife, or at least some portions have a local radius relative to a center non-coincident with the center of the gas knife smaller than the average radius of the gas knife, or both; and a liquid extractor positioned outside of an imaginary circle drawn at the average radius.

7. The apparatus of claim 6, wherein at least some portions of the gas knife are, in plan, substantially straight.

8. The apparatus of claim 6, wherein at least some portions have a local radius of less than 0.9 of the average radius or of greater than 1.1 of the average radius.

9. The apparatus of claim 6, wherein the liquid extractor is positioned at a position along the gas knife at which liquid collects when the substrate is moved relative to the gas knife.

10. The apparatus of claim 9, wherein the liquid extractor does not extend around the whole periphery of the gas knife.

11. The apparatus of claim 6, wherein the local radius is at least ten times larger than the average radius.

12. The apparatus of claim 6, wherein the periphery of the gas knife is split into a plurality of the portions and a liquid extractor is situated at least some boundaries between neighboring portions of a given local radius.

13. A lithographic apparatus, comprising:
- a projection system configured to transfer a pattern from a patterning device onto a substrate, the projection system having an optical axis;
- a liquid supply system configured to provide liquid to a space between the projection system and a substrate and comprising a liquid removal outlet configured to remove liquid from the space;
- a further liquid removal area physically separate from the liquid removal outlet; and
- a gas knife comprising a plurality of segments, each segment being elongate and having an inlet for gas, the gas knife sized, shaped and oriented such that, on movement of the substrate under the liquid supply system and under the gas knife, liquid left on the substrate following passage of the substrate under the liquid removal outlet is transported along the gas knife to the further liquid removal area to be removed at a position, at removal, located between the gas knife and the liquid removal outlet by the further liquid removal area, at least part of the further liquid removal area being located outwardly, relative to the optical axis, of an imaginary circle centered at the optical axis intersecting the segments.

14. The apparatus of claim 13, wherein the liquid removal area is a drain in a substrate table configured to hold the substrate.

15. The apparatus of claim 14, wherein the drain is configured to surround the substrate.

16. The apparatus of claim 13, wherein the gas knife is attached to the liquid supply system.

17. The apparatus of claim 13, wherein the gas knife is moveable independently of the liquid supply system.

18. The apparatus of claim 17, wherein the gas knife is arranged substantially to move in unison with the substrate in a step direction.

19. The apparatus of claim 13, wherein the gas knife is supported by a base frame of the lithographic apparatus from which the projection system, or the liquid supply system, or both, are dynamically isolated.

20. The apparatus of claim 13, wherein the gas knife is arranged to be at an angle to a step direction of the apparatus.

21. The apparatus of claim 13, wherein the gas knife is arranged so as to extend along the whole width of the substrate in a step direction of the apparatus but not in a scan direction, wherein the scan and step directions are substantially orthogonal.

22. The apparatus of claim 13, comprising two gas knives, each situated on an opposite side of the liquid supply system.

23. The apparatus of claim 13, wherein the gas knife is V shaped, with the point of the V substantially aligned with a line of symmetry which splits the substrate in half in a scan direction of the apparatus.

24. The apparatus of claim 13, wherein part of the gas knife is situated on either side of a liquid removal area.

25. The apparatus of claim 24, wherein liquid can be transported along the parts of the gas knife on either side of the liquid removal area towards the liquid removal area.

26. The apparatus of claim 13, wherein the liquid left on the substrate has a free top surface.

27. The apparatus of claim 13, wherein the gas knife is substantially straight or is made up of a plurality of substantially straight portions.

28. The apparatus of claim 27, wherein a liquid extraction device is positioned at a junction between straight portions of the gas knife.

29. An immersion lithographic apparatus, comprising:
- a projection system configured to transfer a pattern from a patterning device, through a liquid, onto a substrate;
- a gas knife; and
- a liquid removal device comprising a plurality of tubes extending into a recess and connected to a suction source, ends of the tubes positioned adjacent the gas knife and the space of the recess extending between at least two adjacent tubes of the plurality of tubes.

30. The apparatus of claim 29, wherein the tube ends have an aspect ratio of less than 5:1.

31. The apparatus of claim 29, wherein a maximum dimension of the tube ends is 5 mm or less.

32. A device manufacturing method comprising projecting a patterned beam of radiation using a projection system through a liquid onto a substrate, wherein liquid is contained by a gas knife at least partly surrounding the space, wherein the gas knife has an average radius relative to the center of the gas knife and the gas knife is shaped, in plan, such that at least some portions have a local radius relative to a center non-coincident with the center of the gas knife larger than the average radius of the gas knife, or at least some portions have a local radius relative to a center non-coincident with the center of the gas knife smaller than the average radius of the gas knife, or both, and wherein liquid is extracted by a liquid extractor positioned outside of an imaginary circle drawn at the average radius.

33. A device manufacturing method comprising projecting a patterned beam of radiation using a projection system through a liquid, supplied by a liquid supply system, onto a substrate and transporting liquid left on the substrate following passage of the substrate under a liquid removal outlet of the liquid supply system along a gas knife to a further liquid removal area, physically separate from the liquid removal outlet, so that is removed at a position, at removal, located between the gas knife and the liquid removal outlet by the further liquid removal area.

34. The method of claim 32, wherein the liquid extractor is positioned at a position along the gas knife at which liquid collects when the substrate is moved relative to the gas knife.

35. The method of claim 33, wherein the gas knife is substantially straight or is made up of a plurality of substantially straight portions.

36. The method of claim 35, wherein liquid is extracted at a junction between straight portions of the gas knife.

* * * * *